(12) United States Patent
Uemura

(10) Patent No.: US 7,042,153 B2
(45) Date of Patent: May 9, 2006

(54) GROUP III NITRIDE COMPOUND SEMICONDUCTOR LIGHT EMITTING ELEMENT

(75) Inventor: Toshiya Uemura, Aichi-ken (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/360,675

(22) Filed: Feb. 11, 2003

(65) Prior Publication Data

US 2003/0151357 A1     Aug. 14, 2003

(30) Foreign Application Priority Data

Feb. 12, 2002   (JP) .............. 2002-034650

(51) Int. Cl.
*H01J 1/62* (2006.01)
*H01J 63/04* (2006.01)

(52) U.S. Cl. ............... 313/506; 313/498; 257/88; 257/103

(58) Field of Classification Search ........ 313/498–500, 313/506, 512; 257/88, 98, 99, 101–103

See application file for complete search history.

(56) References Cited

U.S. PATENT DOCUMENTS

| 5,650,641 A | 7/1997 | Sassa et al. .................. 257/88 |
| 5,945,689 A * | 8/1999 | Koike et al. .................. 257/88 |
| 6,069,440 A * | 5/2000 | Shimizu et al. ............. 313/486 |

FOREIGN PATENT DOCUMENTS

| JP | 08-088407 | 4/1996 |
| JP | 08-088408 | 4/1996 |
| JP | 10-022525 | 1/1998 |
| JP | 10-022527 | 1/1998 |
| JP | 10-144961 | 5/1998 |
| JP | 11-110692 | 4/1999 |

* cited by examiner

*Primary Examiner*—Joseph Williams
*Assistant Examiner*—Kevin Quarterman
(74) *Attorney, Agent, or Firm*—McGinn IP Law Group PLLC

(57) ABSTRACT

A light emitting element suitable for a blue light lamp in a signal light apparatus is provided. The group III nitride compound semiconductor light emitting element includes a first light emitting layer for emitting a first light having a blue light and a second light emitting layer for emitting a second light having a green light. The first light and the second light are combined to provide a third light having a blue-green light synthesized from the first light and the second light.

20 Claims, 9 Drawing Sheets

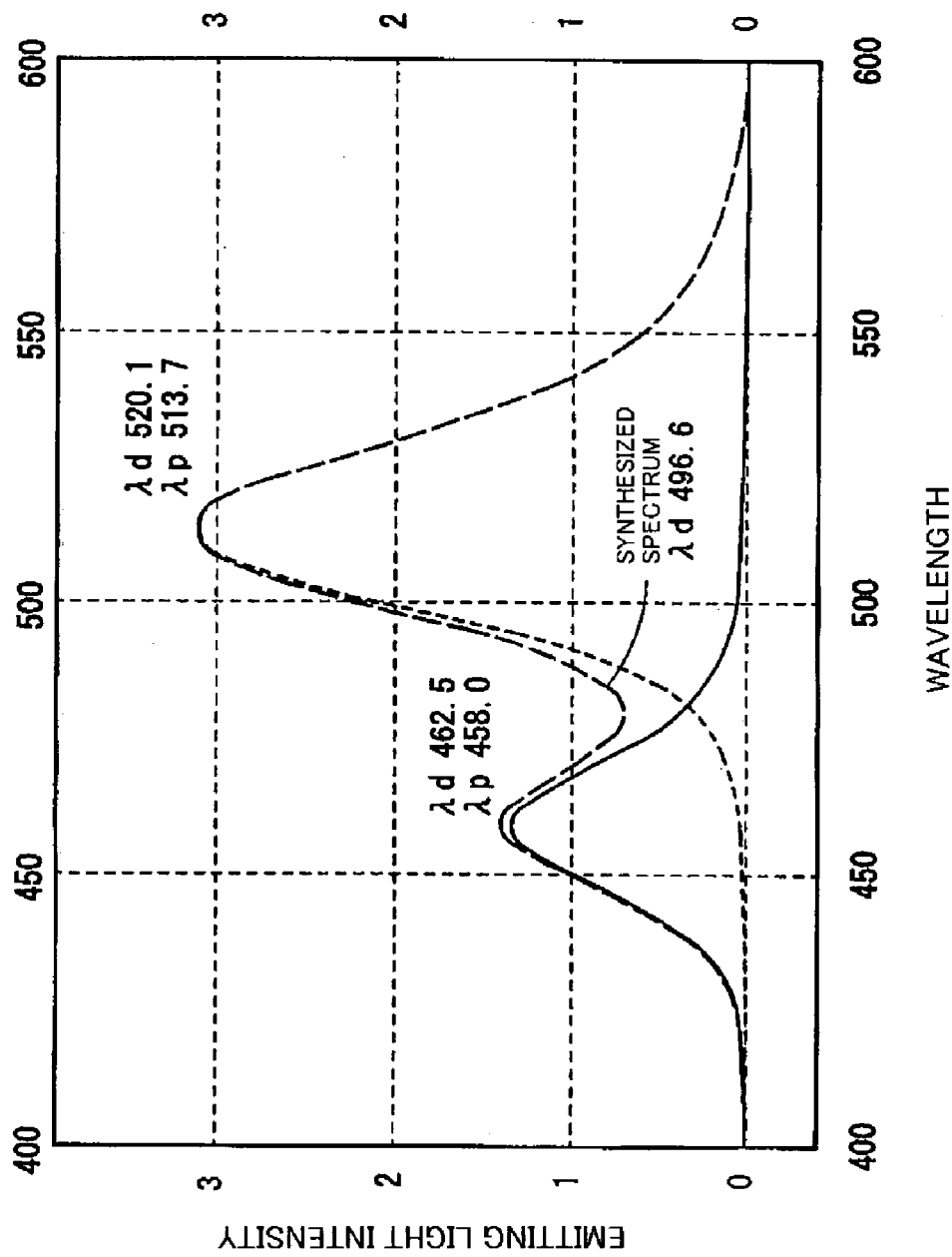

GROUP III NITRIDE COMPOUND SEMICONDUCTOR LIGHT EMITTING ELEMENT

The present application is based on Japanese Patent Application No. 2002-034650, the entire contents of which are incorporated herein by reference.

BACKGROUND OF THE INVENTION

1. Field of The Invention

The invention relates to an improvement in a group III nitride compound semiconductor light emitting element suitable for use in information display apparatuses such as traffic signal light apparatuses.

2. Related Art

Japanese Patent Laid-Open No. 110692/1999 discloses a light emitting element for use in a signal light apparatus. In this prior art technique, a blue light emitting element is used in combination with a green light emitting element to emit light (blue-green color light) of a blue light lamp in a signal light apparatus. The combined use of the blue light emitting element and the green light emitting element enables even a person suffering from defective color vision due to a green cone defect to perceive lighted state/unlighted state of the blue-light lamp. This is because the person suffering from defective color vision due to a green cone defect can perceive light from the blue light emitting element in the blue-light lamp.

Only rare persons among the persons suffering from a blue cone defect cannot perceive blue light. Specifications and the like established by the Metropolitan Police Department prescribe that the color of light emitted from the blue-light lamp should be a blue-green color.

In the conventional blue-light lamp, light emitted from the blue light emitting element and light emitted from the green light emitting element should be balanced with each other for meeting the specifications and the like established by the Metropolitan Police Department. To this end, the individual light emitting elements should be accurately assembled respectively in previously designed positions. Therefore, care should be taken in assembling the light emitting elements. This renders assembling work troublesome.

SUMMARY OF THE INVENTION

Accordingly, an object of the invention is to solve the above problem of the prior art and to provide an improved group III nitride compound semiconductor light emitting element preferably suitable for use in a blue light lamp in a signal light apparatus.

According to the first feature of the invention, a group III nitride compound semiconductor light emitting element comprises a first light emitting layer for emitting a first light having a blue light and a second light emitting layer for emitting a second light having a green light. The first light and the second light are combined to provide a third light having a blue-green light synthesized from the first light and the second light.

In carrying out the invention, a blue light as the first light and a green light as the second light are emitted from a single light emitting element, and the blue light and the green light are combined to provide a blue-green light usable as light of a blue-light lamp in a signal light apparatus. In this case, only one type of light emitting element is assembled in a frame for the blue-light lamp. Therefore, assembling work is easy, and display apparatuses such as signal light apparatuses can be provided at low cost.

BRIEF DESCRIPTION OF THE DRAWINGS

The invention will be explained in more detail in conjunction with the appended drawings, wherein:

FIG. 6 is a diagram showing a spectrum of light emitted from a light emitting element;

DESCRIPTION OF THE PREFERRED EMBODIMENTS

Figure 1:
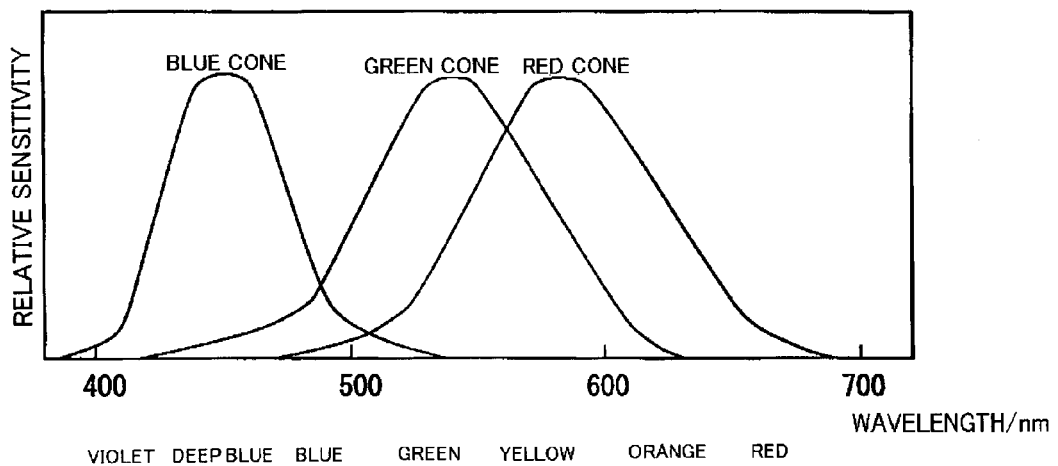
FIG. 1 is a diagram showing the relationship between each cone of a human and the sensitivity thereof.

Individual constituent elements of the invention will be explained in detail.

(Group III Nitride Compound Semiconductor Light Emitting Element)

The light emitting element of a group III nitride compound semiconductor includes a substrate and a group III nitride compound semiconductor layer stacked on the substrate. A p-type electrode and an n-type electrode are further provided.

The substrate may be formed of any material so far as a group III nitride compound semiconductor layer can be grown thereon. Materials for the substrate usable herein include, for example, sapphire, spinel, silicon, silicon carbide, zinc oxide, gallium phosphide, gallium arsenide, magnesium oxide, and manganese oxide. The use of a sapphire substrate is particularly preferred. When the sapphire substrate is used, the a-face is preferably utilized from the viewpoint of growing a group III nitride compound semiconductor layer having good crystallinity.

A group III nitride compound semiconductor layer is stacked on the substrate. Here the group III nitride compound semiconductor is represented by general formula $Al_xGa_yIn_{1-x-y}N$, wherein $0 \leq X \leq 1$, $0 \leq Y \leq 1$, and $0 \leq X+Y \leq 1$, and includes the so-called binary compound semiconductors, such as AlN, GaN, and InN, and the so-called ternary compound semiconductors represented by formulae $Al_xGa_{1-x}N$ wherein $0<x<1$, $Al_xIn_{1-x}N$ wherein $0<x<1$, and $Ga_xIn_{1-x}N$ wherein $0<x<1$. Boron (B), thallium (Tl), etc.

may be substituted for at least a part of the group III element(s). Further, phosphorus (P), arsenic (As), antimony (Sb), bismuth (Bi), etc. may be substituted for at least a part of nitrogen (N). The group III nitride compound semiconductor layer may contain any dopant n-type dopants usable herein include silicon (Si), germanium (Ge), selenium (Se), tellurium (Te), and carbon (C). p-type dopants usable herein include magnesium (Mg), zinc (Zn), beryllium (Be), calcium (Ca), strontium (Sr), and barium (Ba). After doping with a p-type dopant, the group III nitride compound semiconductor may be exposed to electron beams, plasma, or heat in a furnace. This treatment, however, is not indispensable. The group III nitride compound semiconductor layer may be formed by any method without particular limitation, for example, by well-known methods such as metal organic chemical vapor deposition (MOCVD), molecular beam epitaxy (MBE), halide vapor phase epitaxy (HVPE), sputtering, ion plating, and electron shower.

The light emitting element may have a homo structure, a hetero structure, or a double hetero structure. A quantum well structure (a single quantum well structure or a multiple quantum well structure) may also be adopted.

A buffer layer may be provided between the substrate and the crystal layer of a group III nitride compound semiconductor. The purpose of providing the buffer layer is to improve the crystallinity of the group III nitride compound semiconductor grown on the buffer layer. The buffer layer may be formed of a group III nitride compound semiconductor such as AlN, InN, GaN, AlGaN, InGaN, or AlInGaN.

Materials for the p-side electrode usable herein include metals, such as rhodium (Rh), gold (Au), platinum (Pt), silver (Ag), copper (Cu), aluminum (Al), nickel (Ni), cobalt (Co), magnesium(Mg), palladium (Pd), ruthenium (Ru), manganese (Mn), bismuth(Bi), tin (Sn), and rhenium (Re), or alloys of any two or more of them.

These metals or alloys may be formed into a thin film which is then used as a light transparent electrode. For example, a laminate of gold (Au) and cobalt (Co) may be used. Further, when the light emitting element is used as a flip chip, among the metals, rhodium (Rh), platinum (Pt), and ruthenium (Ru) and alloys of these metals are suitable as p-side electrode materials, because these materials can efficiently reflect the emission wavelength of the group III nitride compound semiconductor light emitting element and are low contact resistance to the p-type group III nitride compound semiconductor layer. The p-side electrode may have a two-layer or multilayer structure in which layers different from each other or one another in composition have been stacked on top of each other or one another.

Materials for the n-side electrode usable herein include metals, such as aluminum (Al), vanadium (V) , tin (Sn) , rhodium (Rh), titanium (Ti), chromium (Cr), niobium (Nb), tantalum (Ta), molybdenum (Mo), tungsten (W), and hafnium (Hf), or alloys of any two or more of them. The n-side electrode may have a two-layer or multilayer structure in which layers different from each other or one another in composition have been stacked on top of each other or one another. For example, a two-layer structure of vanadium (V) and aluminum (Al) may be adopted.

The group III nitride compound semiconductor light emitting element may be produced, for example, by the following method.

A substrate on which a group III nitride compound semiconductor layer can be grown is first provided. A plurality of semiconductor layers, that is, at least an n-type group III nitride compound semiconductor layer, layers including light emitting layers each formed of a group III nitride compound semiconductor, and a p-type group III nitride compound semiconductor layer, are stacked in that order on the substrate.

Next, the assembly is etched to expose a part of the n-type semiconductor layer. A p-side electrode and an n-side electrode are then formed on the p-type group III nitride compound semiconductor layer and on the n-type group III nitride compound semiconductor layer, respectively. The p-side electrode and the n-side electrode may be formed by a conventional method such as vapor deposition or sputtering. The substrate is then polished by abrasives having a desired particle diameter to a desired thickness, followed by chip isolation.

(Light Emitting Layers)

In the light emitting element of the invention, two or more light emitting layers including a first light emitting layer and a second light emitting layer are provided. The first light emitting layer emits blue light as a first light, and the second light emitting layer emits green light as a second light.

The structure of layers including light emitting layers is not particularly limited. The structure, however, is preferably such that the first light emitting layer and the second light emitting layer are included in a multiple quantum well structure. In this case, preferably, the first light emitting layer and the second light emitting layer are formed so that a single barrier layer is common to the first light emitting layer and the second light emitting layer. Specifically, the first light emitting layer is formed on the first surface of the single barrier layer, and the second light emitting layer is formed on the second surface of the barrier layer. This can simplify the layer structure. For example, when the two light emitting layers are formed of InGaN and the barrier layer is formed of GaN, the single barrier layer can be common to the two light emitting layers.

The number of first light emitting layers and the number of second light emitting layers are not particularly limited and may be determined by taking into consideration the output of each layer in such a manner that desired blue-green light is provided by simultaneous emission of light from the first light emitting layer and light from the second light emitting layer.

As shown in FIG. 1, when the wavelength of light emitted from the first light emitting layer is not more than 480 nm, the blue cone can perceive this light. However, a wavelength, which is shorter but does not lower the optical output, is preferred, because the shorter the wavelength, the higher the sensitivity of the blue cone. The lower limit of the wavelength of light emitted from the first light emitting layer is about 430 nm. When the wavelength of light emitted from the second light emitting layer is not less than 500 nm, the green cone can perceive this light. However, a wavelength, which is longer but does not lower the optical output, is preferred, because the longer the wavelength, the higher the sensitivity of the green cone. The upper limit of the wavelength of light emitted from the second light emitting layer is about 550 nm.

In the following examples, the ratio of the number of the second light emitting layers to the number of the first light emitting layers was 2:1. The ratio of the number of the first light emitting layers to the number of the second light emitting layers, however, may also be brought to 1:1 or 1:3 by varying the composition or dopant level of the p-type layer and/or the composition of the barrier layer to regulate the quantity of carrier injected into the light emitting layer.

EXAMPLES

The following examples further illustrate the invention.

Example 1

Figure 2:
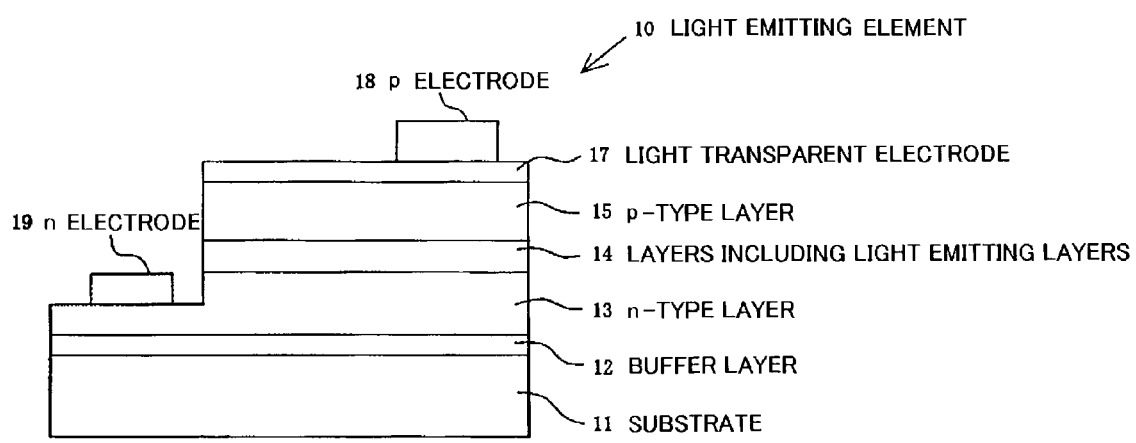
FIG. 2 is a typical cross-sectional view showing the construction of a light emitting element.
Figure 3A:
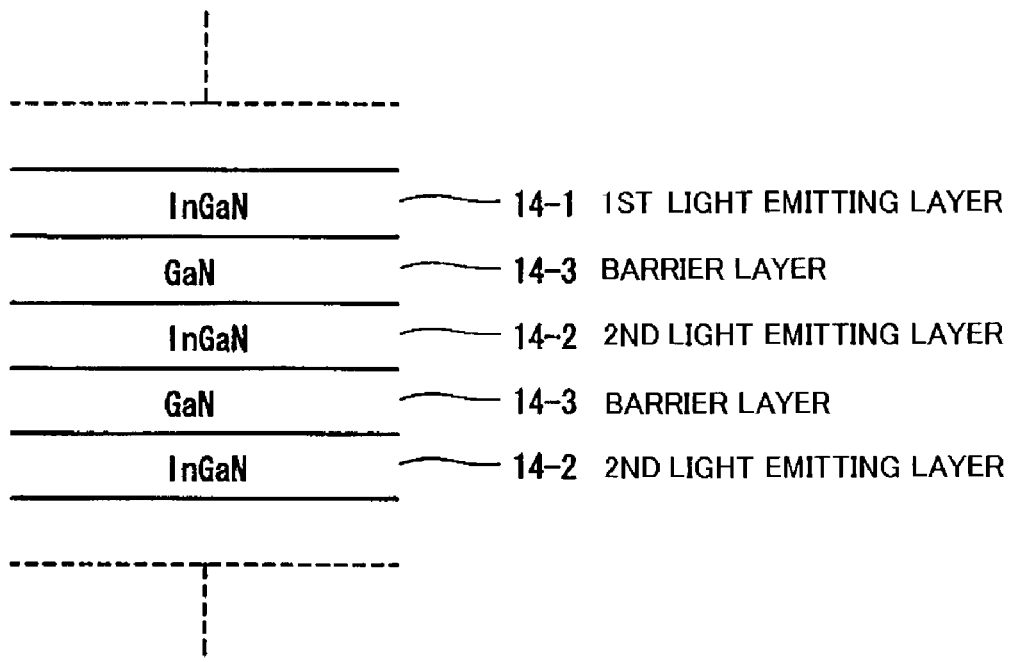
FIGS. 3A and 3B are typical cross-sectional views showing preferred embodiments of the construction of layers including light emitting layers in the light emitting element shown in FIG. 2.
Figure 3B:
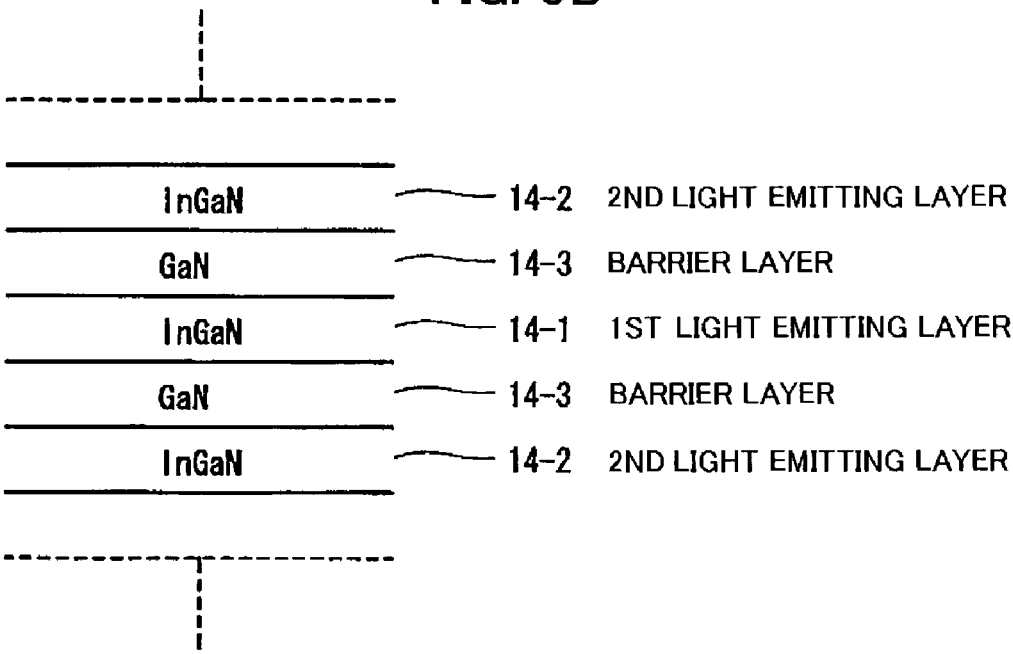

FIG. 2 is a typical cross-sectional view of a light emitting element 10 in a preferred embodiment of the invention, and FIGS. 3A and 3B are typical cross-sectional views showing the detailed construction of light emitting layers. Details of individual layers constituting the light emitting element 10 are as follows.

| Layer | Composition |
|---|---|
| p-type layer 15 | p-GaN:Mg |
| Layers 14 including light emitting layers | Multiple quantum well structure |
| n-type layer 13 | n-GaN:Si |
| Buffer layer 12 | AlN |
| Substrate 11 | Sapphire |

An n-type layer 13 of GaN doped with silicon as an n-type dopant is formed on the substrate 11 through a buffer layer 12. Here sapphire was used as the substrate 11. The substrate 11, however, is not limited to sapphire. For example, sapphire, spinel, silicon, silicon carbide, zinc oxide, gallium phosphide, gallium arsenide, magnesium oxide, manganese oxide, and single crystals of group III nitride compound semiconductors may be used. The buffer layer may be formed by MOCVD using AlN. The material for the buffer layer, however, is not limited to AlN, and other materials for the buffer layer usable herein include, for example, GaN, InN, AlGaN, InGaN, and AlInGaN. Methods for the formation of the buffer layer usable herein include molecular beam epitaxy (MBE), halide vapor phase epitaxy (HVPE), sputtering, ion plating, and electron shower. When the group III nitride compound semiconductor is used as the substrate, the provision of the buffer layer may be omitted.

The substrate and the buffer layer may be if necessary removed after the formation of the semiconductor device.

In this example, the n-type layer 13 was formed of GaN. Alternatively, the n-type layer 13 may be formed of AlGaN, InGaN, or AlInGaN.

Further, in this example, silicon was doped as an n-type dopant into the n-type layer 13. Germanium (Ge), selenium (Se), tellurium (Te), carbon (C) and the like may also be used as the n-type dopant.

The n-type layer 13 may have a two-layer structure composed of an n⁻ layer having a low electron concentration, provided in the side of layers 14 including light emitting layers, and an n⁺ layer having a high electron concentration provided in the side of the buffer layer 12.

As shown in FIG. 3A, in the layers 14 including light emitting layers, two second light emitting layers 14-2 are provided successively from one first light emitting layer 14-1. The second light emitting layer 14-2 is preferably formed on the substrate side. A barrier layer 14-3 is interposed between the first light emitting layer 14-1 and the second light emitting layer 14-2. The composition and thickness of each layer are as follows.

| Layer | Composition | Thickness |
|---|---|---|
| First light emitting layer 14-1 | $In_{0.20}Ga_{0.80}N$ | 2.4 nm |
| Second light emitting layer 14-2 | $In_{0.30}Ga_{0.70}N$ | 3.0 nm |
| Barrier layer 14-3 | GaN | 16 nm |

As shown in FIG. 3B, a first light emitting layer 14-1 may also be formed between second light emitting layers 14-2.

Figure 4:
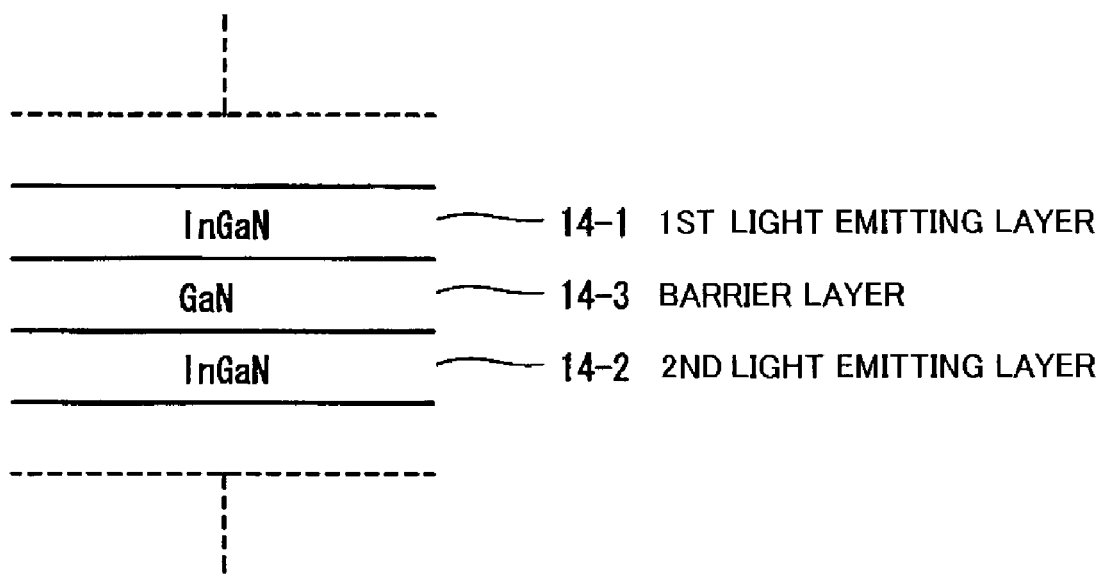
FIG. 4 is a typical cross-sectional view showing another preferred embodiment of the construction of layers including light emitting layers in the light emitting element.

Further, as shown in FIG. 4, a construction may be adopted wherein one first light emitting layer 14-1 and one second light emitting layer 14-2 are provided. In this case, preferably, the second light emitting layer 14-2 is provided in the substrate side.

Figure 5A:
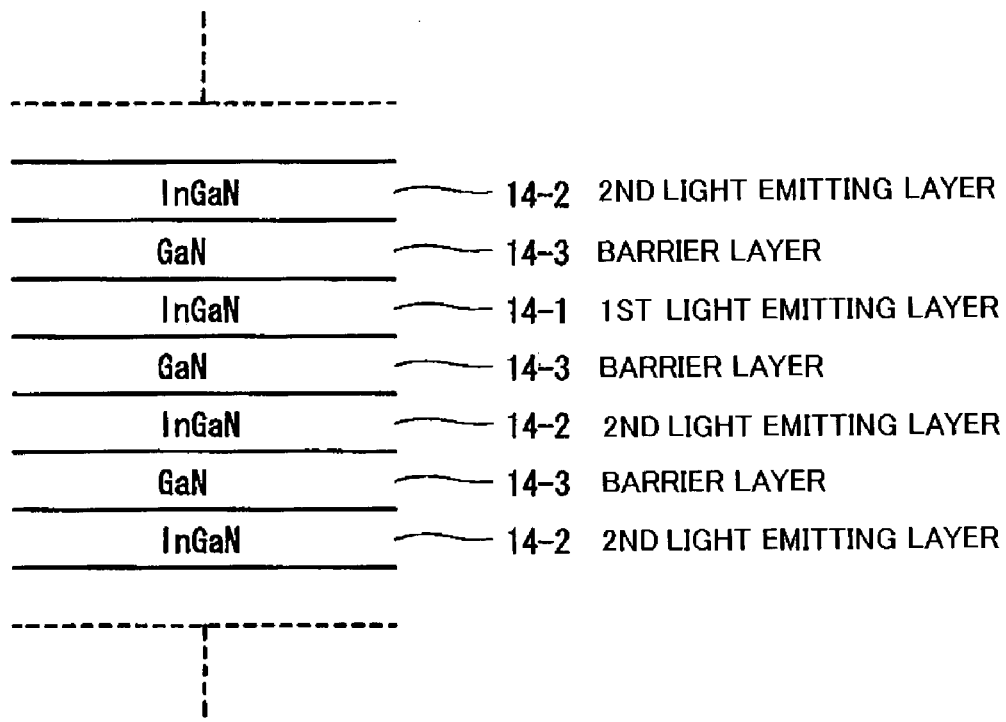
FIGS. 5A and 5B are typical cross-sectional views showing further preferred embodiments of the construction of layers including light emitting layers in the light emitting element.
Figure 5B:
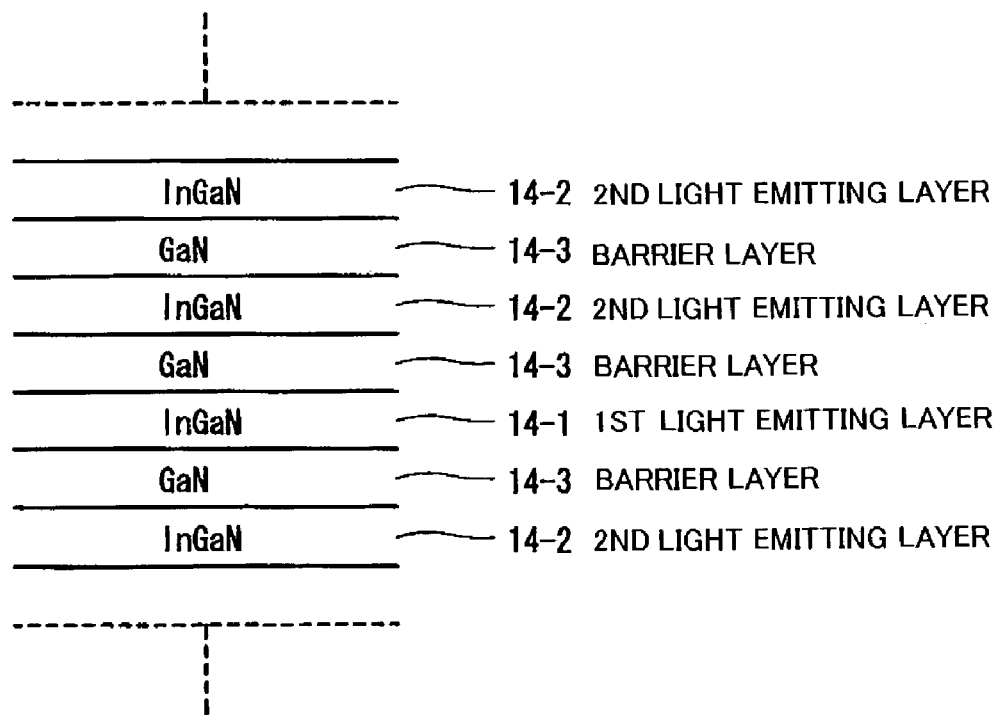

Further, as shown in FIGS. 5A and 5B, a construction may be adopted wherein one first light emitting layer 14-1 and three second light emitting layers 14-2 are provided. Also in this case, preferably, one of the second light emitting layers 14-2 is provided as a layer closest to the substrate.

In the construction shown in FIG. 3A, a blue light having a peak wavelength $\lambda p$ of 458.0 nm and a dominant wavelength $\lambda d$ of 462.5 nm is emitted from the first light emitting layer 14-1, and a green light having a peak wavelength $\lambda p$ of 513.7 nm and a dominant wavelength $\lambda d$ of 520.1 nm is emitted from the second light emitting layer 14-2. As a result, as shown in FIG. 6, a blue-green light having a dominant wavelength $\lambda d$ of 496.6 nm, which can meet specifications for emission wavelength of signal light apparatuses, can be provided.

Layers 14 including light emitting layers may include a wide-band-gap group III nitride compound semiconductor layer doped with an acceptor such as magnesium which is provided in the p-type layer 15 side. The purpose of providing this wide-band-gap group III nitride compound semiconductor layer doped with an acceptor is to effectively prevent the electrons injected into layers 14 including light emitting layers from diffusing into the p-type layer 15.

The p-type layer 15 formed of GaN doped with magnesium as a p-type dopant is formed on the layers 14 including light emitting layers. This p-type layer may also be formed of AlGaN, InGaN, or InAlGaN. Other p-type dopants usable herein include zinc (Zn), beryllium (Be), calcium (Ca), strontium (Sr), and barium (Ba).

The p-type layer 15 may have a two-layer structure composed of a p⁻ layer having a low hole concentration, provided in the side of layers 14 including light emitting layers, and a p⁺ layer having a high hole concentration provided in the electrode side.

In the light emitting diode having the above construction, each group III nitride compound semiconductor layer may be formed by MOCVD under conventional conditions, or alternatively may be formed, for example, by molecular beam epitaxy (MBE), halide vapor phase epitaxy (HVPE), sputtering, ion plating, or electron shower.

In this example, an n electrode 19 has a two-layer structure of aluminum and vanadium. After the p-type layer 15 is formed, a part of the p-type layer 15, the layers 14 including light emitting layers, and the n-type layer 13 are removed by etching, followed by the formation of the n electrode 19 on the n-type layer 13 by vapor deposition.

A light transparent electrode 17 is a thin film containing gold and is stacked on the p-type layer 15. A p electrode 18 also is formed of a gold-containing material and is formed on the light transparent electrode 17 by vapor deposition.

The formation of the semiconductor layers and the electrodes by the above process is followed by isolation of each chip.

Figure 7:
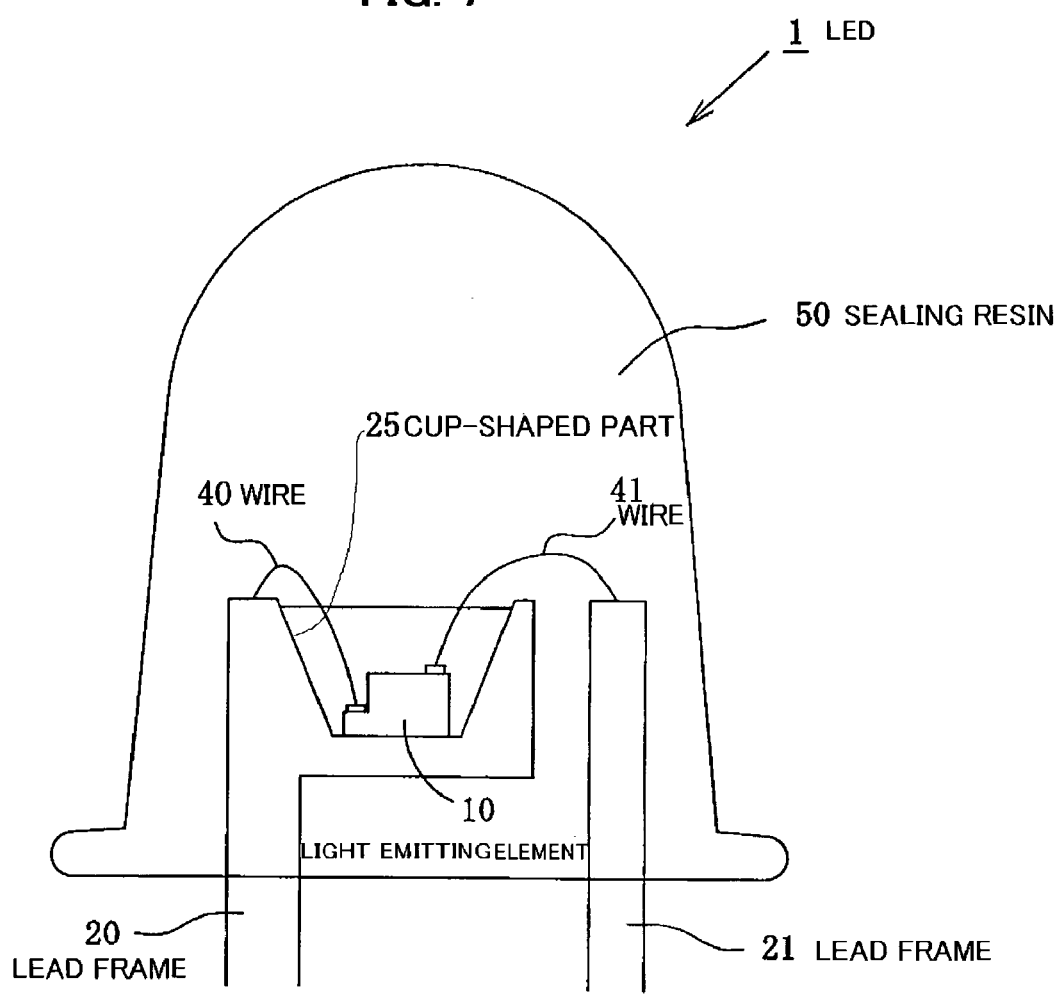
FIG. 7 is a diagram showing the construction of a shell-shaped LED in which a device in an embodiment of the invention has been mounted.

As shown in FIG. 7, the light emitting element 10 is mounted in a cup-shaped part 25 provided on a lead frame 20 with the aid of an adhesive. The adhesive is a silver paste comprising silver as a filler mixed into an epoxy resin. The use of the silver paste can improve the dissipation of heat from the light emitting element 10. Other conventional adhesives such as transparent pastes and white pastes may be used instead of the silver paste.

In the light emitting element 10, the p electrode 18 is wire bonded through a wire 41 to a lead frame 21, while the n electrode 19 is wire bonded through a wire 40 to the lead frame 20.

A sealing resin 50 is provided, for example, from the viewpoint of protecting the device structure. A lens effect may be imparted to the sealing resin 50 by changing the shape of the sealing resin 50 depending upon purposes. For example, the sealing resin 50 may be molded into a shell shape shown in FIG. 7, or into a concave lens shape, a convex lens shape or the like. Further, the shape of the sealing resin 50 may be circular, elliptical, or rectangular as viewed from a light output direction (from above in FIG. 7).

In LED 1 having the above construction, blue light as the first light emitted from the first light emitting layer 14-1 and green light as the second light emitted from the second light emitting layer are simultaneously emitted from the light emitting element 10 to provide blue-green light.

Figure 8:
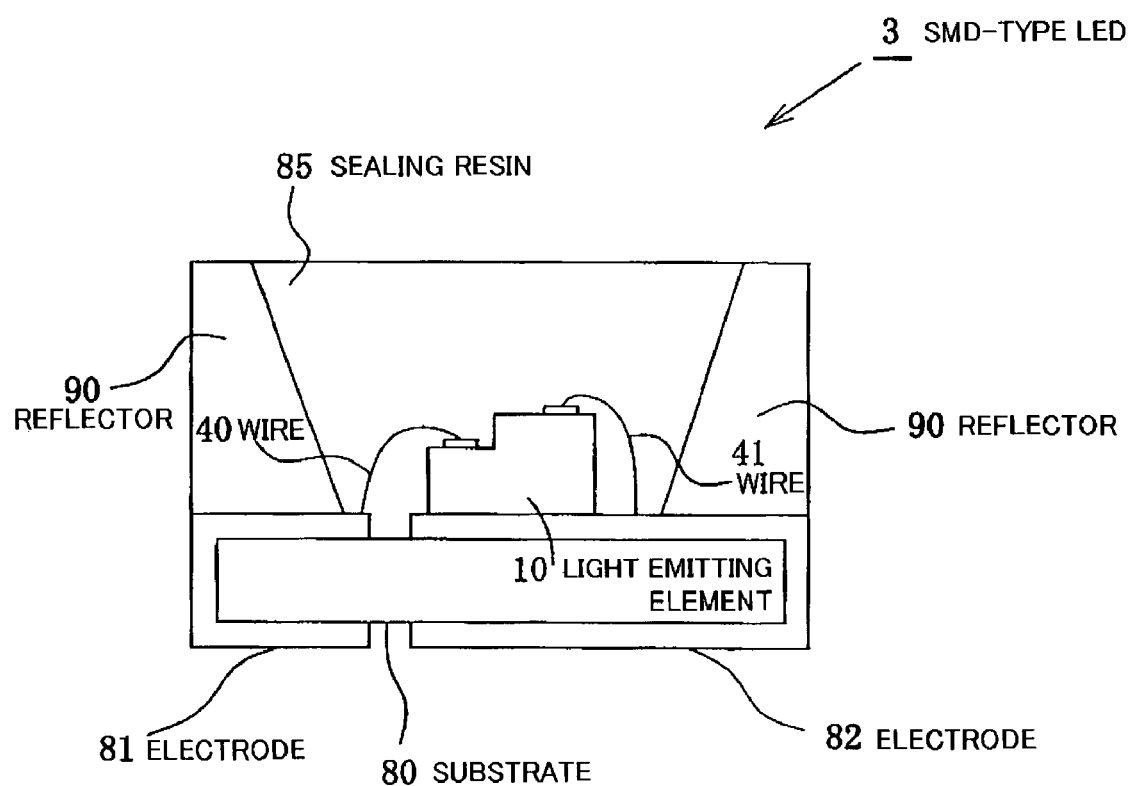
FIG. 8 is a diagram showing the construction of an SMD-type LED in which a device in an embodiment of the invention has been mounted.

FIG. 8 is a schematic cross-sectional view of an SMD-type LED 3 in another preferred embodiment of the invention. In FIG. 7 showing LED 1 and FIG. 8 showing LED 3, like parts are identified with the same reference numerals, and the overlapped explanation thereof will be omitted.

A light emitting element 10 is fixed to a substrate 80 with the aid of a paste. Wires 40 and 41 connect the electrodes in the light emitting element 10 respectively to electrodes 81 and 82 provided on the substrate 80. Numeral 85 designates a sealing resin. Numeral 90 designates a reflector provided on the periphery of the light emitting element. The surface of the reflector 90 has been planished.

As with the LED 1, the LED 3 emits blue-green light.

Figure 9A:
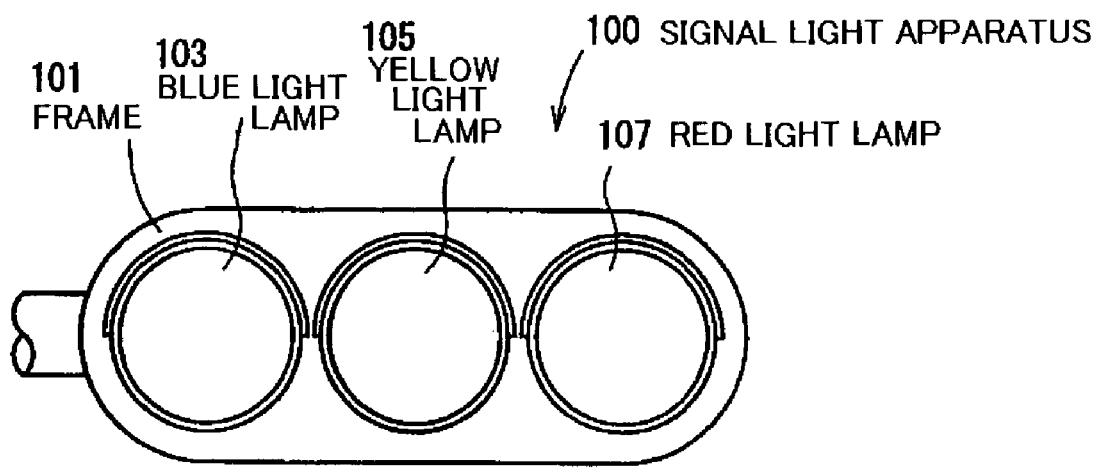
FIGS. 9A and 9B are diagrams showing a preferred embodiment of the signal light apparatus of the invention.

FIG. 9A shows a signal light apparatus 100. This signal light apparatus 100 includes a blue light lamp 103, a yellow light lamp 105, and a red light lamp 107 which have been arranged in that order in a frame 101.

Figure 9B:
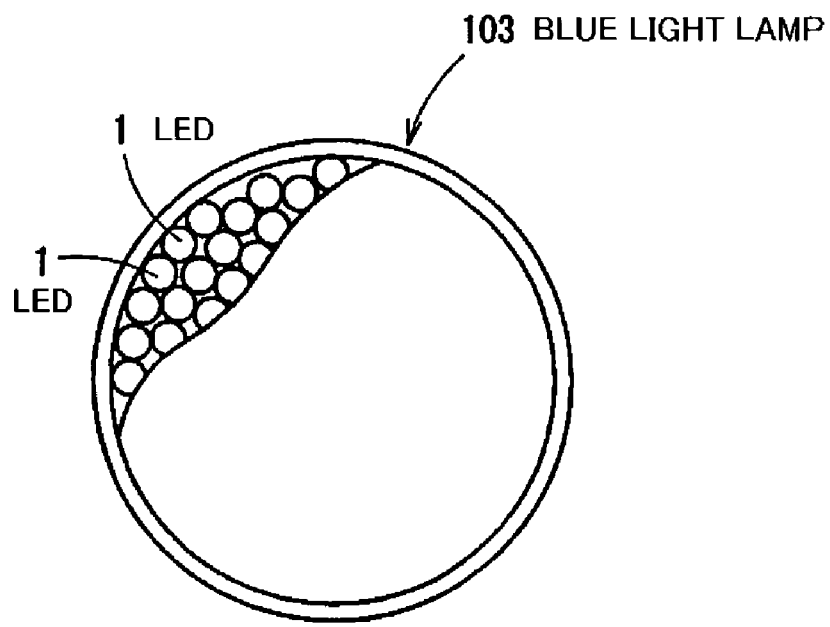

As shown in FIG. 9B, in the blue light lamp 103, LEDs 1 shown in FIG. 7 are arranged in a matrix form. Since LEDs 1 emit blue-green light, the blue light lamp 103 emits light of color which meets the specifications established by the Metropolitan Police Department. The light emitted from LED 1 includes blue light as the first light and green light as the second light. Therefore, persons suffering from defective color vision due to a green cone defect also can perceive at least the first light. This permits the persons suffering from defective color vision due to a green cone defect to surely perceive lighted state/unlighted state of the blue light lamp 103.

The use of the LED 3 can offer the same function and effect as described above.

Figure 10:
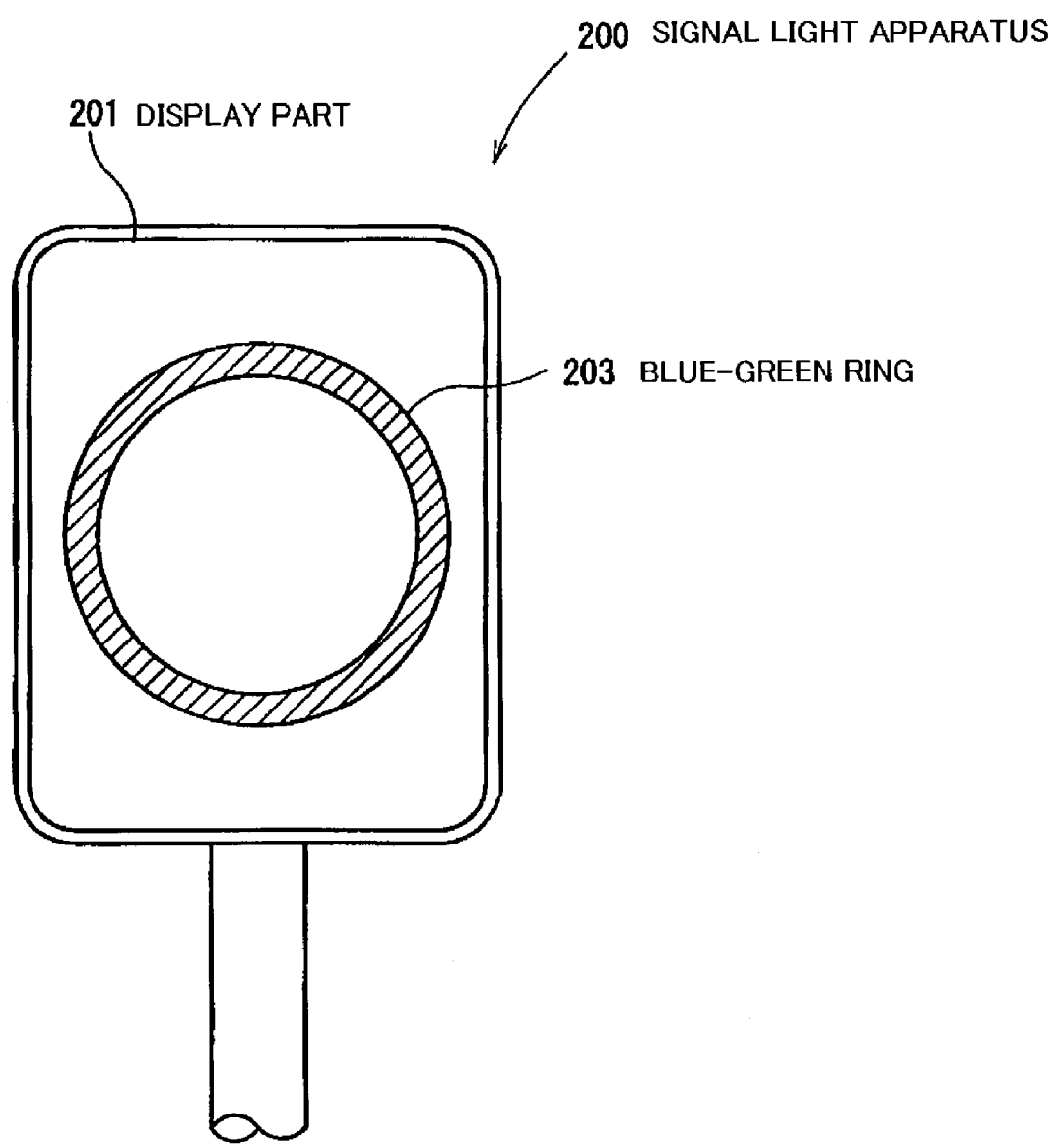
FIG. 10 is a diagram showing another preferred embodiment of the signal light apparatus of the invention.

FIG. 10 shows another type of a signal light apparatus 200 as an information display apparatus. LEDs 1 are arranged in a ring form in a display part 201 in the signal light apparatus 200. Upon lighting of these LEDs 1, a blue-green ring 203 is displayed. This indicates passable or free entry state.

On the other hand, red LEDs (not shown) are also arranged in an X form in the display part 201, and, in the state of impassable or no entry state, the red LEDs are lighted.

Also in this signal light apparatus 200, the ring 203 is displayed by LEDs 1. Therefore, based on the blue light as the first light component in light components emitted from the LEDs 1, even persons suffering from defective color vision due to a green cone defect can accurately perceive the shapes, i.e, ring and X.

As is apparent from the embodiment shown in FIG. 10, the LEDs 1 or the LEDs 3 may be arranged in any form depending upon contemplated information. For example, the LEDs 1 or the LEDs 3 may be arranged in the form of the ring shown in FIG. 10, or other shapes such as arrows, human bodies, or characters.

This invention is not limited to the above embodiments and explanation thereof, and variations and modifications can be effected within the scope which does not depart from the description in the claims and can be easily conceived by a person having ordinary skill in the art.

What is claimed is:

1. A group III nitride compound semiconductor light emitting element comprising:
   a first light emitting layer for emitting a first light perceivable by a blue cone; and
   a second light emitting layer for emitting a second light perceivable by a green cone;
   wherein the first light emitting layer includes a group III element composition which is different than a group III element composition of the second light emitting layer, and
   wherein the first light and the second light are combined to provide a third light synthesized from the first light and the second light.

2. The group III nitride compound semiconductor light emitting element according to claim 1, wherein the peak wavelength of the first light is shorter than substantially 480 nm and the peak wavelength of the second light is longer than substantially 500 nm.

3. The group III nitride compound semiconductor light emitting element according to claim 1, wherein the first light emitting layer and the second light emitting layer are included in a multiple quantum well structure.

4. The group III nitride compound semiconductor light emitting element according to claim 3, wherein the first light emitting layer is provided in contact with a surface of a barrier layer in the multiple quantum well structure and the second light emitting layer is provided in contact with an opposite surface of the barrier layer.

5. The group III nitride compound semiconductor light emitting element according to claim 1, wherein a ratio of the number of the first light emitting layers to the number of the second light emitting layers is 1:1 to 1:3.

6. The group III nitride compound semiconductor light emitting element according to claim 1, wherein said first light emitting layer is adapted to emit said first light perceivable by said blue cone; and
   wherein said second light emitting layer is adapted to emit said second light perceivable by said green cone.

7. An LED comprising:
   a group III nitride compound semiconductor light emitting element comprising a first light emitting layer for emitting a first light perceivable by a blue cone and a second light emitting layer for emitting a second light perceivable by a green cone, wherein the first light emitting layer includes a group III element composition which is different than a group III element composition of the second light emitting layer, and wherein the first light and the second light are combined to provide a third light synthesized from the first light and the second light; and a sealing resin for sealing the group III nitride compound semiconductor light emitting element.

8. The LED according to claim 7, wherein the group III nitride compound semiconductor light emitting element is mounted on a first lead frame, a first electrode of the group III nitride compound semiconductor light emitting element is connected to the first lead frame by a first bonding wire, a second electrode of the group III nitride compound semiconductor light emitting element is connected to a second lead frame by a second bonding wire, and the sealing resin is molded into a shell shape for sealing the group III nitride compound semiconductor light emitting element, the first lead frame and the second lead frame.

9. The LED according to claim 8, wherein the first lead frame has a cup-shaped part.

10. The LED according to claim 7, wherein the group III nitride compound semiconductor light emitting element is mounted on a substrate including a first electrode pattern and a second electrode pattern thereon, a first electrode of the group III nitride compound semiconductor light emitting element is connected to the first electrode pattern of the substrate by a first bonding wire, a second electrode of the group III nitride compound semiconductor light emitting element is connected to the second electrode pattern of the substrate by a second bonding wire, a reflector is provided in the periphery of the group III nitride compound semiconductor light emitting element, and the sealing resin is provided in the reflector for sealing the group III nitride compound semiconductor light emitting element.

11. A signal light apparatus comprising a plurality of LEDs arranged in the predetermined pattern, wherein each of the plurality of LEDs comprises:

a group III nitride compound semiconductor light emitting element comprising a first light emitting layer for emitting a first light perceivable by a blue cone and a second light emitting layer for emitting a second light perceivable by a green cone, wherein the first light emitting layer includes a group III element composition which is different than a group III element composition of the second light emitting layer, and wherein the first light and the second light are combined to provide a third light synthesized from the first light and the second light; and a sealing resin for sealing the group III nitride compound semiconductor light emitting element.

12. The signal light apparatus according to claim 11, wherein the plurality of LEDs are arranged in a matrix pattern.

13. The signal light apparatus according to claim 11, wherein the plurality of LEDs are arranged in a ring form.

14. A group III nitride compound semiconductor light emitting element comprising:

first means for emitting a first light perceivable by a blue cone; and second means for emitting a second light perceivable by a green cone, wherein the first light and the second light are combined to provide a third light synthesized from the first light and the second light.

15. The group III nitride compound semiconductor light emitting element according to claim 14, wherein said first means comprises a first light emitting layer and said second means comprises a second light emitting layer.

16. A group III nitride compound semiconductor light emitting element comprising:

a first light emitting layer that emits a blue light perceivable by a blue cone; and a second light emitting layer that emits a green light perceivable by a green cone, wherein the first light emitting layer includes a group III element composition which is different than a group III element composition of the second light emitting layer.

17. The group III nitride compound semiconductor light emitting element according to claim 1, wherein the blue light and the green light are combined to provide a third light synthesized from the blue light and the green light.

18. The group III nitride compound semiconductor light emitting element according to claim 16, wherein the peak wavelength of the first light is less than substantially 480 nm and the peak wavelength of the second light is greater than substantially 500 nm.

19. An LED comprising:

a group III nitride compound semiconductor light emitting element comprising a first light emitting layer that emits a first light perceivable by a blue cone and a second light emitting layer that emits a second light perceivable by a green cone, wherein the first light emitting layer includes a group III element composition which is different than a group III element composition of the second light emitting layer, and wherein the first light and the second light are emitted to provide a third light synthesized from the first light and the second light.

20. The LED according to claim 19, further comprising:

a sealing resin that seals the group III nitride compound semiconductor light emitting element.

* * * * *